(12) United States Patent
Cao

(10) Patent No.: US 7,579,919 B1
(45) Date of Patent: Aug. 25, 2009

(54) METHOD AND APPARATUS FOR COMPENSATING TEMPERATURE CHANGES IN AN OSCILLATOR-BASED FREQUENCY SYNTHESIZER

(76) Inventor: Weixun Cao, 10175 McLaren Pl., Cupertino, CA (US) 95014

(*) Notice: Subject to any disclaimer, the term of this patent is extended or adjusted under 35 U.S.C. 154(b) by 15 days.

(21) Appl. No.: 12/110,249

(22) Filed: Apr. 25, 2008

Related U.S. Application Data

(60) Provisional application No. 60/998,813, filed on Oct. 13, 2007.

(51) Int. Cl.
H03C 3/06 (2006.01)
H03L 1/00 (2006.01)

(52) U.S. Cl. .......................... 331/176; 331/23; 332/128

(58) Field of Classification Search ................. 331/176, 331/23; 332/128
See application file for complete search history.

(56) References Cited

U.S. PATENT DOCUMENTS 5,126,699 A * 6/1992 Kabler ....................... 332/124

2004/0146098 A1 * 7/2004 Eliezer et al. ............... 375/227

* cited by examiner

Primary Examiner—Joseph Chang
(74) Attorney, Agent, or Firm—Joe Zheng

(57) ABSTRACT

Architectures for compensating the frequency drift of an oscillator based frequency synthesizer circuit due to the change of temperature are disclosed. By applying a digitally controlled frequency word which represents the frequency difference between an output signal of a crystal oscillator and a temperature-compensated signal obtained from the output of a frequency synthesizer, the generated frequency signal is controlled so as to be temperature compensated over a wide temperature range. In one embodiment, a frequency locked loop is provided to perform functions to compensate for possible drifts in the reference signal. The frequency locked loop receives a digital frequency corrected control word based on at least a first parameter and a second parameter, wherein the first parameter is a combination of a fixed frequency control word and an automatic frequency correction word, and the second parameter is derived from an external source.

21 Claims, 8 Drawing Sheets

METHOD AND APPARATUS FOR COMPENSATING TEMPERATURE CHANGES IN AN OSCILLATOR-BASED FREQUENCY SYNTHESIZER

CROSS REFERENCE TO RELATED APPLICATION

This application claims the benefits of U.S. Provisional Application Ser. No. 60/998,813, entitled "Method and Apparatus for Temperature Compensation of an Oscillator Based Frequency Synthesizer", filed on Oct. 13, 2007, the content of which is hereby incorporated by reference for all purpose in its entirety.

BACKGROUND OF THE INVENTION

1. Field of the Invention

The present invention is generally related to electronic circuits, and more particularly, related to architectures for compensating the frequency drift of an oscillator based frequency synthesizer circuit due to the change of temperature are disclosed.

2. Description of the Related Art

To ensure all electronic parts to work properly or in synchronization, providing an accurate timing clock signal is very important in electronic circuit designs. Usually, such a timing clock signal is produced in a crystal oscillator that is an electronic circuit using the mechanical resonance of a vibrating crystal of piezoelectric material to create an electrical signal with a frequency. This frequency is commonly used to keep track of time (as in quartz wristwatches), to provide a timing clock signal for digital integrated circuits, and to stabilize frequencies for radio transmitters/receivers. One of the factors that causes a timing clock signal different from the design is the temperature that may affect the piezoelectric material and operation of the crystal oscillator. As the temperature changes, the frequency from the crystal oscillator also changes. In reality, electronic devices, such as portable computers, portable phones and electronic meters, may be used in a wide variety of environments in which temperature varies, it is important that these devices operate as designed without failures or malfunctions due to the changes of the temperature.

Many modern communication devices, such as the GPS and GSM systems, require a highly accurate and stable frequency to increase the sensitivity of a transceiver therein and to reduce the acquisition/track time. The frequency output of a crystal oscillator is multiplied by a known factor in a frequency synthesizer to obtain a desired channel frequency. Typically, the crystal oscillator frequency is in the range of tens of MHz while the channel frequency is in the range of GHz. Unfortunately, the output of a crystal oscillator tends to drift with ages and temperature changes. A simple crystal oscillator (XO) does not provide a means for controlling the crystal's frequency variation as the ambient temperature changes. Due to the stringent requirements, it is not possible to use a cost-effective stand-alone crystal oscillator in a cellular system without some frequency tuning support from the base station.

A frequency source in a wireless communication device or mobile handset generally includes a digitally controlled crystal oscillator (DCXO) or temperature-compensated crystal oscillator (TCXO). Unfortunately, a DCXO circuit requires large capacitors to perform frequency corrections on the crystal oscillator. Thus, it is extremely expensive to use a DCXO circuit, especially for a deep submicron CMOS process. Furthermore, the switching of a large number of capacitors in the DCXO to adjust the crystal oscillator frequency may result in frequency beating effects that exhibit themselves as spurs in the generated frequency output.

In a conventional temperature-compensated crystal oscillator (TCXO), a thermostat generates a correction voltage to keep the oscillator's frequency constant. Such a voltage-controlled TCXO has a temperature sensor that generates a linear voltage in proportion to the temperature. With a $3^{rd}$-order linear function voltage generator and a voltage controlled crystal oscillator circuit (VCXO), the outputs of the temperature sensor and the $3^{rd}$-order function voltage generator are provided to the VCXO which compensates for the temperature vs. frequency characteristics of the crystal being used.

However, such a voltage-controlled TCXO first requires a high quality crystal to meet the $3^{rd}$-order linear compensation requirement, which is expensive, particularly, when the size of the crystal is reduced. It is also difficult to achieve high frequency stability and accuracy, as the maximal output frequency of a crystal oscillator is limited. Further, it is difficult to control small frequency changes (e.g. less than 1.0 Hz) in a voltage-controlled TCXO as it is difficult to generate accurately an analog voltage in the range of micro volts.

Therefore, there is a need for a low-cost, low-noise, and high accurate solution for generating a frequency in a wide frequency range and to be temperature compensated over a wide temperature range.

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention pertains to architectures of compensating frequency in an output in reference to a reference signal, where the reference signal is from a crystal oscillator. Due the changes of the temperature, the frequency in the reference signal drifts. According to one aspect of the present invention, an architecture is so designed to compensate for possible drifts in the reference signal and produce a steady signal. According to another aspect of the present invention, a frequency locked loop is provided to perform functions to compensate for possible drifts in the reference signal. The frequency locked loop receives a digital frequency corrected control word based on at least a first parameter and a second parameter, wherein the first parameter is a combination of a fixed frequency control word and an automatic frequency correction word, and the second parameter is derived from an external source.

Depending on implementation, the present invention may be implemented as a method, a system and an architecture of integrated circuit. According to one embodiment, the present invention is an architecture that comprises: a frequency locked loop operating based on a reference frequency received from a crystal oscillator; a frequency correction unit producing a digital frequency corrected control word based on a first parameter and a second parameter, wherein the first parameter is a combination of a fixed frequency control word and an automatic frequency correction word; and an interpolation logic producing the second parameter representing a compensation to changes in temperature, wherein the frequency locked loop produces a timing clock signal when the first parameter is kept constant, or wherein the frequency locked loop produces a frequency modulated signal when the first parameter is a sequence of bits representing the frequency changes of a frequency modulating signal.

According to another embodiment, the present invention is an architecture that comprises: a frequency locked loop operating based on a reference frequency received from a crystal oscillator, wherein the frequency locked loop includes a voltage controlled oscillator (VCO) that takes a sample from an output of the frequency locked loop for stabilizing the output due to temperature changes; a frequency correction unit producing a digital frequency corrected control word based on a first parameter and a second parameter, wherein the first parameter is a combination of a fixed frequency control word and an automatic frequency correction word; and an interpolation logic producing the second parameter representing a compensation to changes in temperature, wherein the first parameter is a sequence of bits representing the frequency changes of a frequency modulating signal, resulting in the output being a frequency modulated signal.

According to yet another embodiment, the present invention is an architecture that comprises: a frequency locked loop operating based on a reference frequency received from a crystal oscillator, wherein the frequency locked loop includes a digitally controlled oscillator (DCO) that takes a sample from an output of the frequency locked loop for stabilizing the output; a frequency correction unit producing a digital frequency corrected control word based on a first parameter and a second parameter, wherein the first parameter is a combination of a fixed frequency control word and an automatic frequency correction word; and an interpolation logic producing the second parameter representing a compensation to changes in temperature, wherein the first parameter is a sequence of bits representing the frequency changes of a modulating signal, resulting in the output being a frequency modulated signal.

Other objects, features, benefits and advantages, together with the foregoing, are attained in the exercise of the invention in the following description and resulting in the embodiment illustrated in the accompanying drawings.

BRIEF DESCRIPTION OF THE DRAWINGS

These and other features, aspects, and advantages of the present invention will be better understood with regard to the following description, appended claims, and accompanying drawings where:

DETAILED DESCRIPTION OF THE PREFERRED EMBODIMENTS

The detailed description of the present invention is presented largely in terms of functional blocks, procedures, logic blocks, processing, or other symbolic representations that directly or indirectly resemble the operations of a RF transmitter that can be used in wireless communications. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
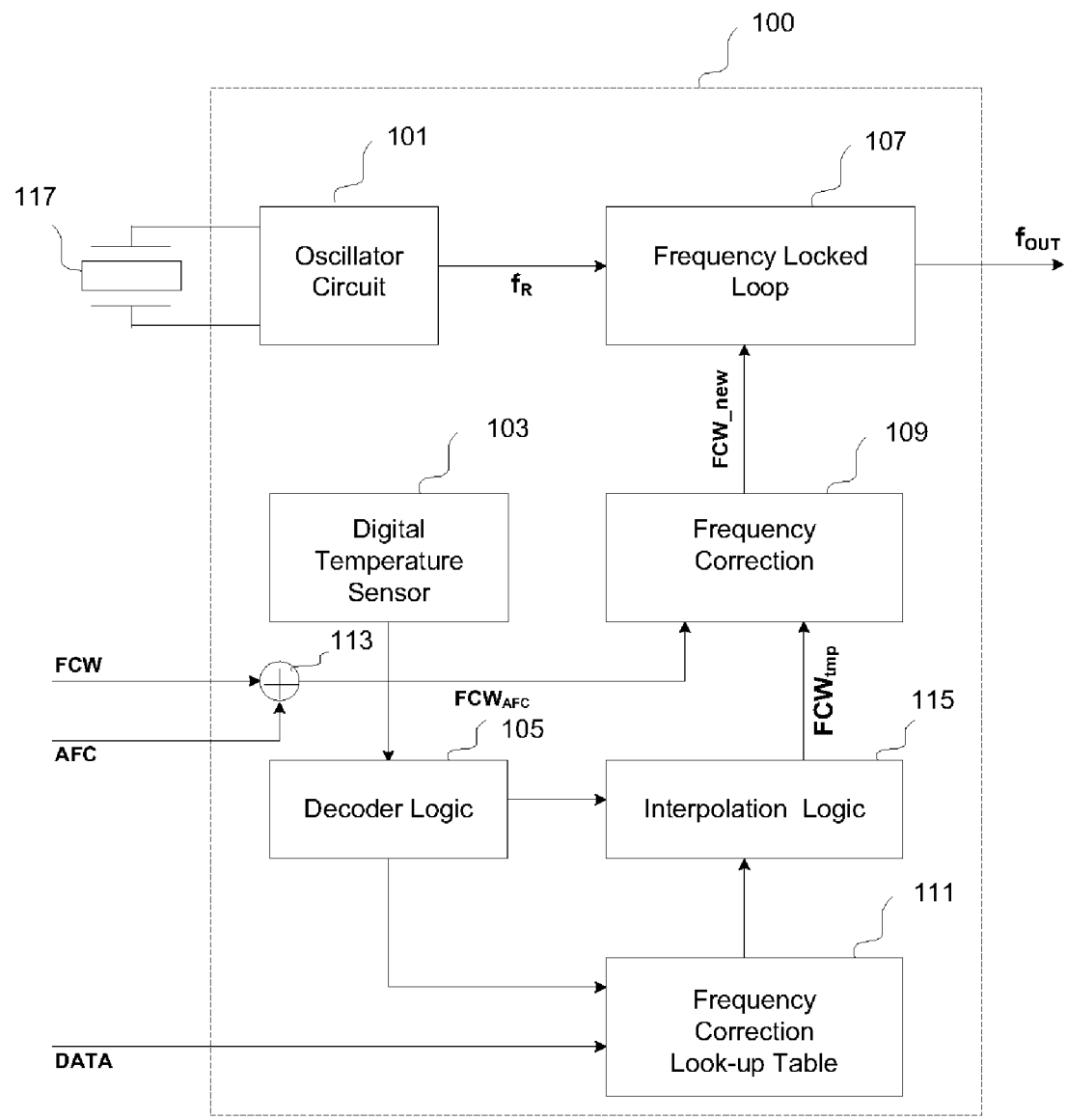
FIG. 1 is a block diagram of a temperature compensated frequency synthesizer using digitally-controlled frequency-locked loop (FLL) with a crystal oscillator, in accordance with the present invention.

Referring now to the drawings, in which like numerals refer to like parts throughout the several views. FIG. 1 shows an exemplary temperature compensated frequency synthesizer 100 providing a substantially temperature compensated frequency output, $f_{OUT}$, in accordance with the present invention. A reference frequency signal, $f_R$, is generated by an free running oscillator circuit 101 with a crystal oscillator 117. This reference frequency signal $f_R$ is used as a reference clock for the frequency locked loop 107 that generates the required output frequency, $f_{OUT}$, by using a frequency corrected control signal, FCW_new. One of the features, objectives and advantages in the present invention is that the frequency drift of the reference clock $f_R$ can be compensated by the frequency corrected control signal, FCW_new. According to one embodiment, the frequency corrected control signal, FCW_new is generated by the frequency correction unit 109, where $$Fout = K \cdot FCW\_new \cdot f_R;$$

where K is a scaling coefficient. Depending on the scaling coefficient, a desired timing clock signal can be obtained.

A frequency correction circuit 109 is provided to generate the frequency corrected control data, generally expressed in bits (e.g., 32 bits), also referred herein as a frequency corrected control word FCW_new, by compensating automatic frequency control data or word, $FCW_{AFC}$, with a frequency correcting value, $FCW_{tmp}$ from an interpolation logic 115, where:

$$FCW\_new = FCW_{AFC} + FCW_{tmp}.$$

The automatic frequency control word, $FCW_{AFC}$, includes a fixed frequency control signal or word, FCW, and an automatic frequency correction word, AFC. In one embodiment, FCW changes within a defined range, thus FCW can also be used as a frequency modulation signal to generate a frequency modulated output $f_{OUT}$. As used herein, a word does not necessarily mean 8 bits, it means data represented in a sequence of bits (e.g., 8-bit, 16-bit or 32-bit). The automatic frequency control word, $FCW_{AFC}$, can be expressed as:

$$FCW_{AFC} = FCW + AFC$$

For example, it is desired to generate a frequency modulated (FM) signal within a frequency range of 890 MHz~910 MHz, FCW is a sequence of bits representing the frequencies in the range. As FCW changes, so does $FCW_{AFC}$. Likewise AFC may also be used as a sequence of bits representing the frequencies in the range. As a result, the exemplary temperature compensated frequency synthesizer 100 of FIG. 1 functions as a FM generator with temperature compensated frequencies. The automatic frequency correction word AFC is provided externally.

In one embodiment, the AFC word may be determined by the timing information sent by a wireless infrastructure basestation or other accurate frequency sources. The frequency drift in the reference clock, $f_R$, such as a crystal oscillator 117 can be compensated by changing the value of the AFC word. Thus, the reference clock can run freely without adjustment in the crystal oscillator frequency. For the frequency modulation, the AFC word as a frequency modulated signal is used as an input of the frequency synthesizer circuit 100 while the FCW is used to set the channel frequency.

GSM and wideband code-division multiple-access (WCDMA) standards described in "3GPP TS 05.10 V8.12.0 (2003-08), *Digital Cellular Telecommunications System (Phase 2+); Radio Subsystem Synchronization (Release 1999)*", which is hereby incorporated by reference, require a mobile station (i.e., a handset) to transmit signals with carrier frequency accuracy better than 0.1 ppm compared to the signals received from a basestation. This accuracy is far beyond a best crystal oscillator could achieve without feedback correction. This frequency feedback correction loop is commonly referred to as automatic frequency control (AFC) in the GSM standard. The AFC correction signal is a digital signal. The conventional AFC loop implementation converts the AFC digital signal back to the analog domain through an AFC digital-to-analog converter (DAC). This analog signal then controls the frequency of the off-chip voltage-controlled crystal oscillator (VCXO) or voltage-controlled temperature compensated crystal oscillator (VCTCXO). Thus, one extra DAC is required. Given the drawbacks of the off-chip VCXO implementation, a digitally controlled AFC word provides an attractive low-cost solution.

A digital temperature sensor 103 is used to sense the temperature of the temperature compensated oscillator 100 surrounding the crystal 117, and to provide its digital temperature output to a decoder logic circuit 105. In one embodiment, the digital output has an enough resolution over the required temperature range of the temperature compensated frequency synthesizer 100.

The decoder logic 105 decodes the digital temperature and provides the decoded signal to a look-up table 111 and the interpolation logic circuit 115. The look-up table 111 provides the appropriate frequency correcting signal to the interpolation logic circuit 115. In other words, the look-up table 111 drives the interpolation logic circuit 115 to adjust the frequency correcting signal, $FCW_{tmp}$, according to the decoded digital temperature provided by the decoder logic circuit 105.

Figure 2:
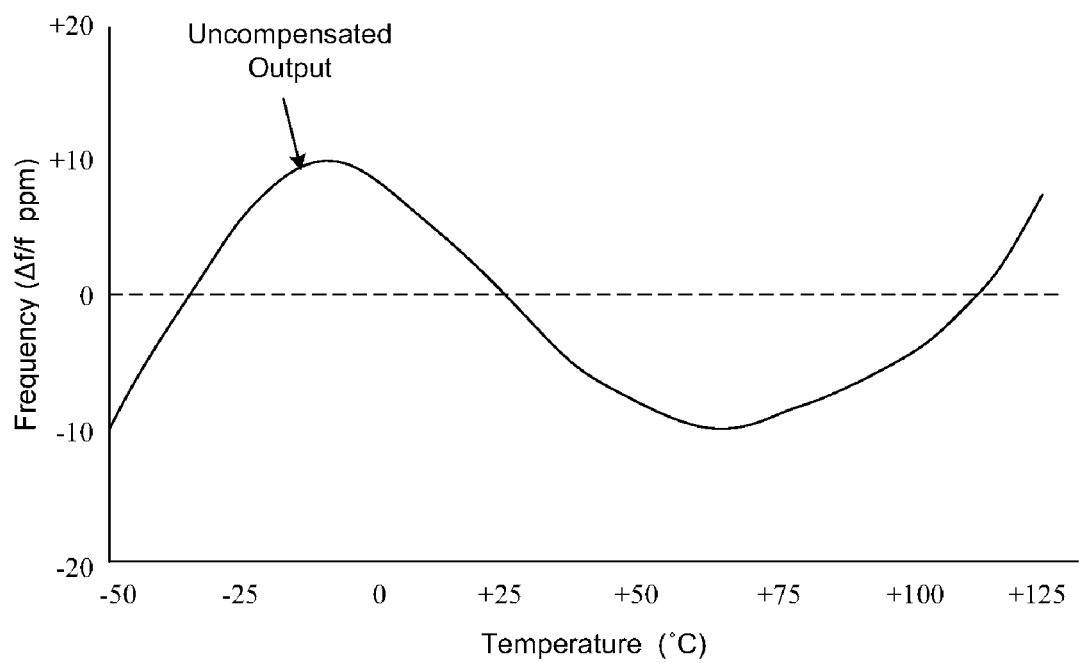
FIG. 2 is a graph of an uncompensated temperature-frequency characteristic curve of a quartz crystal.
Figure 3:
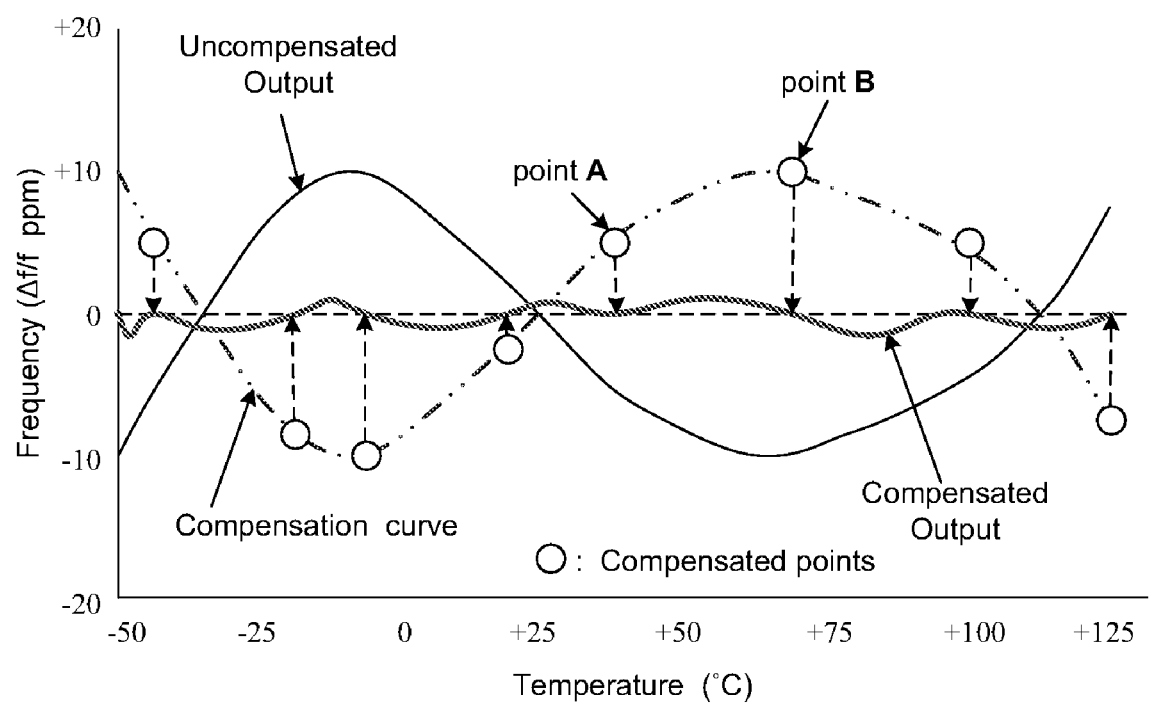
FIG. 3 is a graph of a temperature compensated curve with point-to-point temperature-frequency corrections in accordance with the uncompensated temperature-frequency characteristic of a crystal oscillator.

FIG. 2 shows a graph of uncompensated frequency versus temperature changes for a typical AT-cut quartz crystal having a frequency stability of about ±10 ppm over a temperature range from –50° C. to 125° C. FIG. 3 shows a graph of the compensated frequency output versus temperatures utilizing the temperature compensation circuit shown 100 of FIG. 1. It shows that the frequency drift of the compensated output is greatly reduced in comparison with the uncompensated output.

The frequency-temperature compensated points are shown as circles in FIG. 3. The decoded digital temperature is stored with its corresponding frequency correcting word in the look-up table. The frequency correcting word at each temperature point is accurately measured during manufacturing or testing by comparing the output frequency $f_{OUT}$ and the actually expected frequency. The frequency correcting words are programmed into the look-up table by using the input signal, DATA. The frequency correcting values between two compensated points, such as point A and B shown in FIG. 3, are estimated by using the linear interpolation logic 115. The more the compensated points stored in the look-up table, the more accurate the interpolated frequency correcting word are. However, the hardware cost of the look-up table increases while the number of compensated points stored in the look-up table increases. According to one embodiment, it can be flexibly designed to minimize the size of the look-up table while meeting the required frequency stability over the operating temperature range in accordance with the present invention.

Figure 4:
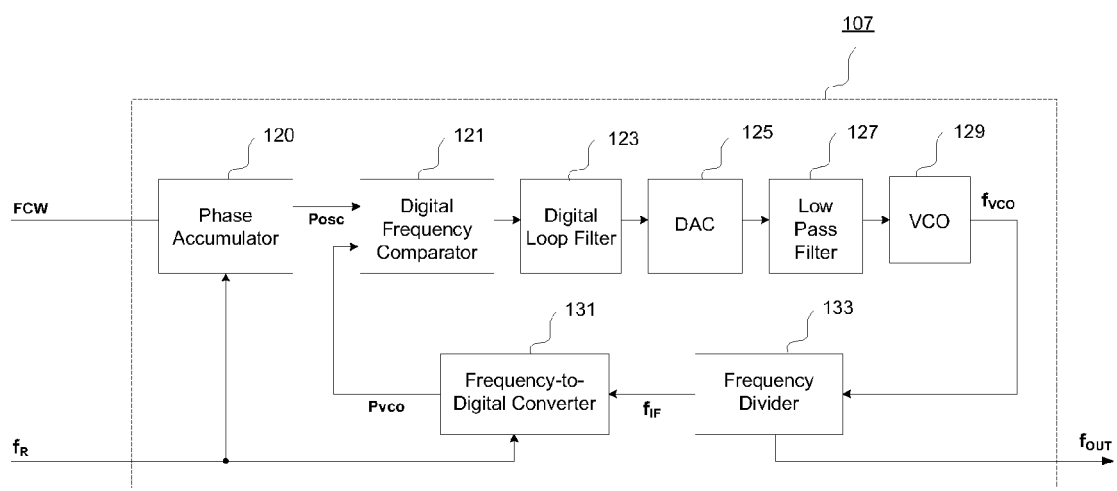
FIG. 4 is a block diagram of a frequency locked loop which uses a digital frequency control word FCW to set the required output frequency based on the reference frequency $f_R$, in accordance with the present invention.

FIG. 4 shows a block diagram of a frequency locked loop 107 according to one embodiment of the present invention. The frequency locked loop 107 may be used in FIG. 1 and is used to lock the frequency according to the expected output frequency defined by the frequency control word, FCW. The frequency locked loop 107 comprises a digital phase accumulator 120, a digital frequency comparator 121, a digital loop filter 123, a digital-to-analog converter (DAC) 125, a low pass filter 127 and a voltage-controlled oscillator 129 with a feedback loop containing a frequency divider 133 and a frequency-to-digital converter 131.

The frequency locked loop 107 works in frequency domain in contrast to the traditional phase locked loop that works in phase domain. The major advantage of a frequency locked loop is that the frequency comparator 121 can achieve a high linearity and can be designed with full digital logic. For a traditional phase locked loop, the phase signal is a periodic signal with a period of $2\pi$ and the phase detector (or comparator) introduces the noise and phase spurs. The phase locked loop is usually designed using an analog circuit which is expensive and difficult to meet the integration requirement. Further it is sensitive to the process, voltage and environment changes.

For a frequency looked loop, an output of any expected frequency can be generated by specifying the FCW value. The frequency resolution is defined by the FCW wordlength of the phase accumulator 120 and the reference frequency clock $f_R$. With a 32-bit FCW and a 50 MHz reference clock $f_R$, the frequency resolution can achieve to $50 MHz/2^{32}=0.01$ Hz.

With the frequency locked loop, the low noise and high accuracy can be achieved by using the digital loop filter 123 and a high linear digital frequency comparator 121. However, the output frequency $f_{OUT}$ will change with the variations in the reference frequency $f_R$. This frequency drift in the output signal $f_{OUT}$ can be compensated as described above.

The frequency divider 133 is used in the feedback path to down-convert the radio-frequency signal $f_{VCO}$ generated by the voltage-controlled oscillator VCO 129 to an intermediate frequency $f_{IF}$, where $f_{IF}=f_{VCO}/div\_n$ and div_n is the divider ratio of the frequency divider 133.

The frequency-to-digital converter 131 provides a digital frequency data stream representing the frequency value of its input signal $f_{IF}$. The function of the frequency-to-digital converter 131 is to counter the number of clock period (rising edge or falling edge) of the input signal by using the sampling reference clock $f_R$. The counted clock number is normalized to form a digital frequency data stream, Pvco, which is used as one of the inputs of digital frequency comparator 121.

The phase accumulator 120 generates a reference data stream, Posc, which represents the frequency value defined by the frequency control word, FCW, based on the crystal oscillator frequency $f_R$. When the loop is locked, the digital frequency data stream Pvco should be the same as the reference data stream, Posc. The digital frequency comparator 121 generates an error signal by comparing Pvco with Posc. This error signal is then digitally filtered by the digital loop filter 123. The digital loop filter provides the control of loop bandwidth and lock settling time. By using the digital loop filter, the loop bandwidth and settling time can be dynamically controlled based on the requirement of the frequency locked loop, such as phase noise and settling time.

The output of the digital loop filter 123 is used as an input of the digital-to-analog converter (DAC) 125 to generate an analog signal. This analog output signal of the DAC 125 is further filtered by a low pass filter 127 and to be used to control the input voltage of the voltage controlled oscillator 129. When the loop is locked, the output of the voltage controlled oscillator 129 is locked at the required frequency which is set by the frequency control word FCW.

Figure 5:
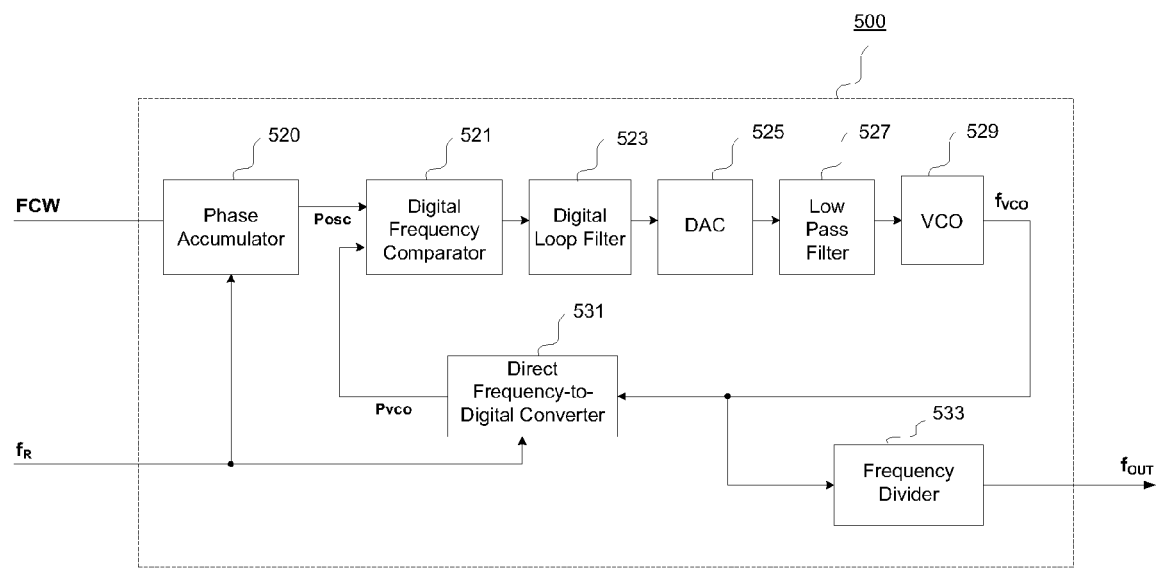
FIG. 5 is a block diagram of a frequency locked loop in an alternative architecture with a direct frequency-to-digital converter.

FIG. 5 shows a block diagram of a frequency locked loop 500 in an alternative architecture. A direct frequency-to-digital converter 531 is used to directly convert the output signal of the VCO 529 into a digital frequency data stream, Pvco. For the direct frequency-to-digital converter 531 the frequency sampling is realized by sampling a known low-frequency reference clock, $f_R$, with a high-frequency output signal, such as the VCO output, $f_{VCO}$. One of the advantages of this architecture is to increase the accuracy of the frequency-to-digital converter 531 as the high frequency signal of the VCO output can be used to sample the low frequency reference clock, $f_R$. It is known that the accuracy of the frequency-to-digital convert is in proportion to the used sampling frequency. The higher the sampling frequency, the more accuracy the result is, and also the lower the noise. Besides, this architecture simplifies (or eliminates) the design of the frequency divider in the feedback path and reduces the hardware cost and the related power consumption. For different output frequencies, an additional frequency divider 533 can be used to divide the VCO output $f_{VCO}$ to a required output frequency $f_{OUT}$.

Figure 6:
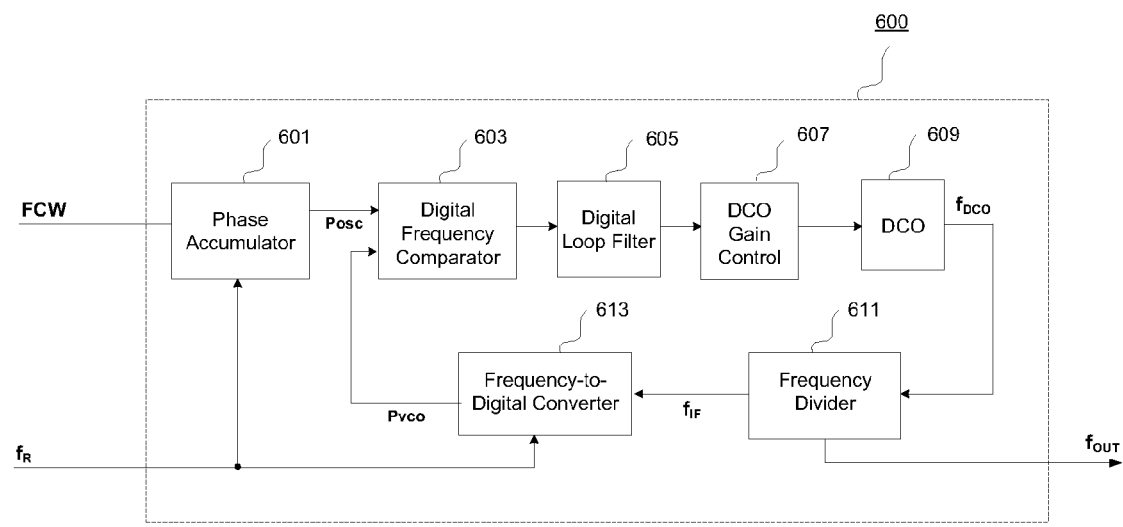
FIG. 6 is a block diagram of a frequency locked loop using a digitally controlled oscillator (DCO) instead of a voltage controlled oscillator, in accordance with the present invention.

FIG. 6 shows a block diagram of a frequency locked loop 600 using a digitally controlled oscillator (DCO) instead of a voltage controlled oscillator (VCO), in accordance with one embodiment of the present invention. The DCO is designed by using an array of digitally-controlled varactors in place of analog voltage-controlled varactors used in conventional VCOs. An array of weighted binary switchable capacitance devices, such as varactors, could be switched into a high-capacitance mode or a low-capacitance mode by a two-level digital control signal. The fine resolution can be achieved by dithering the digital control bits using the delta-sigma modulation.

As shown in FIG. 6, the functionality of the phase accumulator 601, the digital frequency comparator 603, the digital loop filter 605 and the feedback path containing a frequency divider 611 and a frequency-to-digital converter 613 have the same functionalities shown in FIG. 4. The phase accumulator 601 generates a reference data stream, Posc, which represents the frequency value defined by the input frequency control word, FCW, based on the crystal oscillator frequency $f_R$. The frequency-to-digital converter 613 provides a digital frequency data stream, Pvco, representing the frequency value of its input signal $f_{IF}$ which is generated by the frequency divider 611. The digital frequency comparator 121 generates an error signal by comparing the digital frequency data stream, Pvco, with the reference data stream, Posc. This error signal is then digitally filtered by the digital loop filter 605.

The output of the digital loop filter 605 is coupled to the input of the DCO gain control unit 607 to generate a digital control signal used to control the array of weighted binary switchable varactors of the DCO. The DCO gain control unit 607 is used to normalize the DCO gain and to decouple the DCO phase and frequency information from process, voltage and temperature. A feedback path is used to down convert the radio-frequency signal $f_{DCO}$ generated by the digitally-controlled oscillator DCO 609 to an intermediate frequency $f_{IF}$ which is further converted into a digital frequency data stream, Pvco, by the frequency-to digital converter 613. When the loop is locked, the digital frequency data stream, Pvco, is locked to the reference data stream, Posc, by using the Digital Frequency Comparator 603. Thus, the DCO's output, $f_{DCO}$, is locked at the required frequency which is set by the frequency control word FCW.

As shown in FIG. 6, by using the DCO instead of the analog VCO the whole frequency-locked loop 600 can be implemented in a fully digital manner by eliminating the digital-to-analog converter and the low pass filter which are used in FIG. 5. Thus, the frequency signal will not be corrupted by noise and other environment effect which are sensitive to the analog circuits. This architecture is especially suitable for the low-voltage deep-submicron CMOS process as the linear range of the oscillator is very compressed and has undesirable high gain which makes the oscillator extremely susceptible to noise and operating point shifts.

Figure 7:
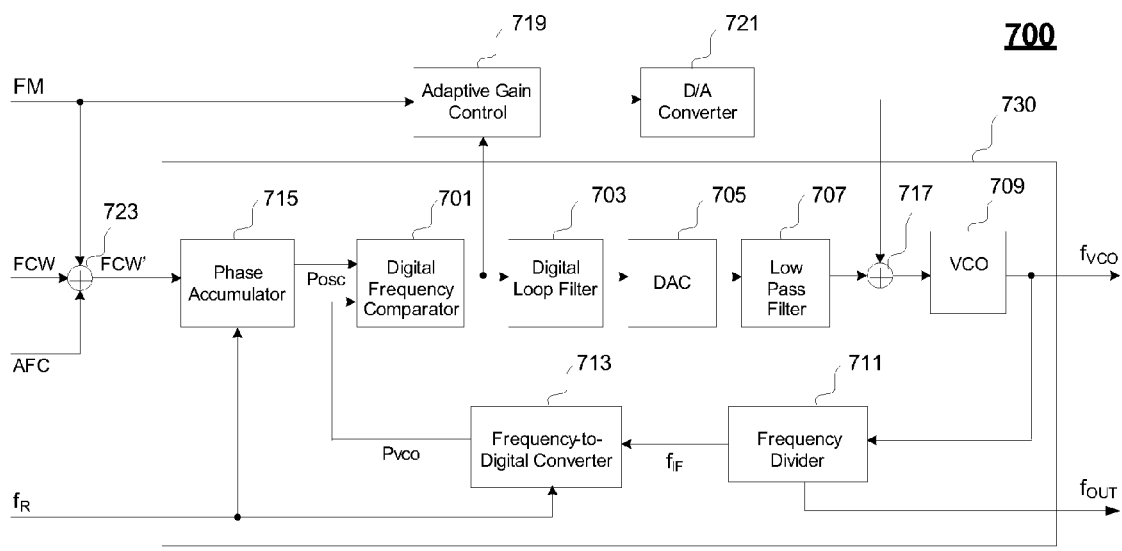
FIG. 7 is a block diagram of a two point modulation architecture using the frequency locked loop and a voltage controlled oscillator (VCO)

FIG. 7 shows a block diagram of a two point modulation architecture using the frequency locked loop (FLL) 730 and a voltage controlled oscillator (VCO) 709. The frequency modulated signal, FM, is a phase differentiated digital input word to fit the FCW frequency format of the FLL input. The modulating data FM is injected into two points of the FLL for the direct frequency modulation. At one injection point, the FM signal is added with the FCW and AFC digital word together using the adder 723. This combined modulated signal FCW' is then converted into a reference data stream, Posc, which represents the frequency value defined by the frequency control word, FCW'.

At another injection point, the FM signal is first converted into an analog signal using the digital/analog converter 721, and then is added to the input control signal of the VCO 709 by using the adder 717. This injected modulating signal will directly modulate the VCO output and result in the change in the frequency data stream, Pvco, generated by the frequency-to-digital converter 713. The change in the reference data stream, Posc, and the frequency data stream, Pvco, due to the injection of the FM modulating signal will be cancelled with each other at the output of the digital frequency comparator 701. Thus, the loop filter can operate at a narrow bandwidth to reduce the frequency spurs and noise while locking the channel frequency with FCW and compensating the frequency drift with the AFC. As the FLL is applied to track the carrier frequency without passing the modulation signal into the FLL loop filter, the FLL can be implemented with a narrow loop bandwidth. The wideband frequency modulated signal is directly used to modulate the VCO with an adaptive gain control unit in an open loop manner. Thus, both wide bandwidth and low output noise for a frequency synthesizer and modulator can be achieved.

In order to compensate the nonlinear effect of the VCO 709 due to the process, voltage and temperature drift, an adaptive gain control unit 719 is provided to use the frequency error as the input generated by the digital frequency comparator 701 and to adaptively change the gain of the VCO by scaling the modulating signal FM based on the received frequency error.

Figure 8:
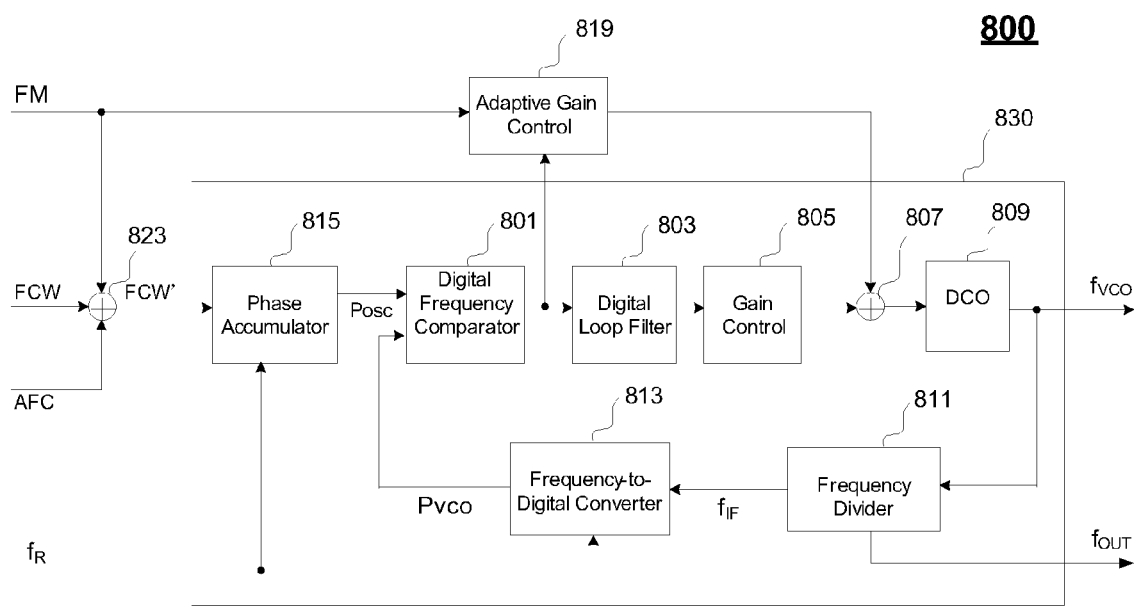
FIG. 8 is a block diagram of a two point modulation architecture using the frequency locked loop and a digitally controlled oscillator (DCO).

FIG. 8 shows a block diagram of a two point modulation architecture using the frequency locked loop (FLL) and a digitally-controlled oscillator (DCO) instead of an analog voltage-controlled oscillator (VCO). It uses a DCO based frequency locked loop (FLL) 830 as shown in FIG. 6. The frequency modulating signal FM is injected into two points: one is the adder 823 and the other is the adder 807, which will result in a value change in the reference data stream, Posc, and in the frequency data stream, Pvco, respectively. This change in Posc and Pvco should be cancelled at the output of the digital frequency comparator 801. To compensate the process, voltage and frequency drift of the DCO's gain, an adaptive gain control unit 819 is used to scale the frequency modulating signal FM before it is injected to the input of the DCO 809. The FLL shown in FIG. 8 can be implemented with all digital circuits and allows for wideband frequency modulation.

The present invention may be implemented in different forms. According to one embodiment, the present invention is implemented as an integrated circuit or a part of system-on-chip and used in an electronic device to provide a steady timing clock signal. In another embodiment, the present invention is used to modulate frequencies of a signal. In still another embodiment, the present invention is used in an instrument to produce various signals in accordance with manual inputs to a panel.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

I claim:

1. An architecture comprising:
   a frequency locked loop operating based on a reference frequency received from a crystal oscillator;
   a frequency correction unit producing a digital frequency corrected control word based on a first parameter and a second parameter, wherein the first parameter is a combination of a fixed frequency control word and an automatic frequency correction word; and
   an interpolation logic producing the second parameter representing a compensation to changes in temperature,
   wherein the frequency locked loop produces a timing clock signal when the first parameter is kept constant, or
   wherein the frequency locked loop produces a frequency modulated signal when the first parameter is a sequence of bits representing frequency changes of a modulating signal.

2. The architecture as recited in claim 1, wherein the digital frequency corrected control word is noted as FCW_new, the reference frequency is noted as $f_R$, and the timing clock signal is noted as $F_{out}$, there exists an equation expressed as:

$$Fout = K \cdot FCW\_new \cdot f_R,$$

wherein K is a scaling coefficient.

3. The architecture as recited in claim 2, wherein the timing clock signal reaches a desired frequency by adjusting the scaling coefficient.

4. The architecture as recited in claim 3, wherein the digital frequency corrected control word compensates a frequency drift in the reference frequency so that the timing clock signal is steady without being affected by the changes in temperature.

5. The architecture as recited in claim 4, wherein the fixed frequency control word is provided externally, and is a sequence of bits representing the desired frequency of the timing clock signal.

6. The architecture as recited in claim 5, wherein the automatic frequency correction word is determined from an accurate frequency source.

7. The architecture as recited in claim 6, wherein the accurate frequency source is timing information sent by a wireless infrastructure basestation.

8. The architecture as recited in claim 1, further including:
   a digital temperature sensor sensing ambient temperature including temperature of an integrated circuit built upon the architecture;
   a decoder logic, coupled to the digital temperature sensor, receiving and decoding digital temperature measurement from the digital temperature sensor;
   a look-up table for storing relationships between appropriate frequency correcting signals and corresponding temperatures, and driving the interpolation logic circuit to adjust the second parameter.

9. The architecture as recited in claim 1, wherein the frequency locked loop comprises:
   a digital phase accumulator to receive the digital frequency corrected control word from the frequency correction unit, wherein a frequency resolution of the timing clock signal or the frequency modulated signal is defined by a word length of the digital phase accumulator and the reference frequency;
   a digital frequency comparator comparing an output of the digital phase accumulator and an output of a feedback loop containing a frequency divider and a frequency-to-digital converter;
   a digital loop filter, coupled to the digital frequency comparator, to filter an error signal from the digital frequency comparator, wherein the digital loop filter provides a control of loop bandwidth and lock settling time;
   a digital-to-analog converter, coupled to the digital loop filter, receiving an output of the digital loop filter to generate an analog signal; and
   a low pass filter provided to filter the analog signal that further controls an input voltage of a voltage controlled oscillator (VCO), wherein the frequency locked loop is locked when an output of the voltage controlled oscillator is locked at the desired frequency.

10. The architecture as recited in claim 9, wherein the frequency locked loop further comprises a direct frequency-to-digital converter used to directly convert the output signal of the VCO, after being down-converted, into a digital frequency data stream by using the frequency reference.

11. The architecture as recited in claim 9, wherein the frequency locked loop further comprises a direct frequency-to-digital converter used to directly convert the output signal of the VCO by sampling the frequency reference using the output signal of the VCO.

12. The architecture as recited in claim 11, wherein the frequency locked loop further comprises a frequency divider used to divide the output of VCO to achieve the timing clock signal.

13. The architecture as recited in claim 8, wherein the frequency locked loop comprises:
   a digital phase accumulator to receive the digital frequency corrected control word from the frequency correction unit, wherein a frequency resolution of the timing clock signal or the frequency modulated signal is defined by a word length of the digital phase accumulator and the reference frequency;

a digital frequency comparator comparing an output of the digital phase accumulator and an output of a feedback loop containing a frequency divider and a frequency-to-digital converter;

a digital loop filter, coupled to the digital frequency comparator, to filter an error signal from the digital frequency comparator, wherein the digital loop filter provides a control of loop bandwidth and lock settling time;

a digitally controlled oscillator (DCO) gain control unit, based on an output of the digital loop filter, to generate a digital control signal used to control an array of weighted binary switchable varactors of the DCO, wherein the DCO gain control unit is used to decouple phase and frequency information from process, voltage and temperature; and a digitally-controlled oscillator generating a radio-frequency signal that is converted to an intermediate frequency that is further converted into a digital frequency data stream by a frequency-to digital converter, wherein the frequency locked loop is locked when the digital frequency data stream is locked to the reference data stream.

14. The architecture as recited in claim 13, wherein the array of weighted binary switchable varactors is switched into a high-capacitance mode or a low-capacitance mode by a digital control signal.

15. The architecture as recited in claim 14, wherein the frequency resolution of the timing clock signal or the frequency modulated signal is achieved by dithering bits of the digital control signal using delta-sigma modulation.

16. An architecture comprising:
a frequency locked loop operating based on a reference frequency received from a crystal oscillator, wherein the frequency locked loop includes a voltage controlled oscillator (VCO) that takes a sample from an output of the frequency locked loop for stabilizing the output due to temperature changes;

a frequency correction unit producing a digital frequency corrected control word based on a first parameter and a second parameter, wherein the first parameter is a combination of a fixed frequency control word and an automatic frequency correction word; and an interpolation logic producing the second parameter representing a compensation to changes in temperature, wherein the first parameter is a sequence of bits representing frequency changes of a modulating signal, resulting in the output being a frequency modulated signal.

17. The architecture as recited in claim 16, wherein a frequency modulated signal is a phase differentiated digital input word provided as one of inputs to the frequency locked loop, the modulating data is injected for direct frequency modulation.

18. The architecture as recited in claim 17, wherein the frequency modulated signal is meanwhile first converted into an analog signal using a digital-to-analog converter and then added to the VCO by using an adder, the frequency modulated signal directly modulates an input of the VCO.

19. An architecture comprising:
a frequency locked loop operating based on a reference frequency received from a crystal oscillator, wherein the frequency locked loop includes a digitally controlled oscillator (DCO) that takes a sample from an output of the frequency locked loop for stabilizing the output;

a frequency correction unit producing a digital frequency corrected control word based on a first parameter and a second parameter, wherein the first parameter is a combination of a fixed frequency control word and an automatic frequency correction word; and an interpolation logic producing the second parameter representing a compensation to changes in temperature, wherein the first parameter is a sequence of bits representing a range of frequencies, resulting in the output being a frequency modulated signal.

20. The architecture as recited in claim 19, wherein a frequency modulated signal is a phase differentiated digital input word provided as one of inputs to the frequency locked loop, the modulating data is injected for direct frequency modulation.

21. The architecture as recited in claim 20, wherein the frequency modulated signal is meanwhile coupled to the DCO by using an adder via an adaptive gain control, the frequency modulated signal directly modulates an input of the DCO.

* * * * *